(12) United States Patent
Hsiao et al.

(10) Patent No.: US 9,472,661 B1
(45) Date of Patent: Oct. 18, 2016

(54) SEMICONDUCTOR STRUCTURE

(71) Applicant: UNITED MICROELECTRONICS CORP., Hsinchu (TW)

(72) Inventors: Shih-Yin Hsiao, Chiayi County (TW); Chang-Po Hsiung, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/798,948

(22) Filed: Jul. 14, 2015

(30) Foreign Application Priority Data

Jun. 24, 2015 (CN) .......................... 2015 1 0352792

(51) Int. Cl.
| | | |
|---|---|---|
| *H01L 29/66* | (2006.01) | |
| *H01L 29/78* | (2006.01) | |
| *H01L 29/06* | (2006.01) | |
| *H01L 29/40* | (2006.01) | |
| *H01L 29/10* | (2006.01) | |

(52) U.S. Cl.
CPC ....... *H01L 29/7823* (2013.01); *H01L 29/0623* (2013.01); *H01L 29/0653* (2013.01); *H01L 29/1095* (2013.01); *H01L 29/404* (2013.01)

(58) Field of Classification Search
CPC .................................................. H01L 29/7835
USPC .......................................... 257/339, 341, 343
See application file for complete search history.

(56) References Cited

U.S. PATENT DOCUMENTS

| | | | |
|---|---|---|---|
| 6,833,586 B2 | 12/2004 | Tsuchiko | |
| 7,309,636 B2 | 12/2007 | Chen | |
| 7,781,808 B2 * | 8/2010 | Ito | ........................ H01L 27/1203 257/273 |

* cited by examiner

*Primary Examiner* — Tan N Tran
(74) *Attorney, Agent, or Firm* — WPAT, PC; Justin King

(57) ABSTRACT

A semiconductor structure suitable for operating under a high voltage condition is provided. According to one aspect of the disclosure, the semiconductor structure includes a substrate, a gate, a source region, a drain region and a field-adjusting structure. The gate is disposed on the substrate. The source region and the drain region are disposed in the substrate and at opposite sides of the gate. The field-adjusting structure is disposed on the substrate at an outer side of one of the source region and the drain region. The field-adjusting structure comprises a first portion and a second portion. The second portion is disposed at an outer side of the first portion. The first portion is connected to the gate. The second portion is connected to the one of the source region and the drain region.

16 Claims, 6 Drawing Sheets

SEMICONDUCTOR STRUCTURE

This application claims the benefit of People's Republic of China application Serial No. 201510352792.3, filed on Jun. 24, 2015, the subject matter of which is incorporated herein by reference.

BACKGROUND

1. Technical Field

The disclosure relates to a semiconductor structure. More particularly, the disclosure relates to a semiconductor structure comprising a field-adjusting structure.

2. Description of the Related Art

Typically, a semiconductor device may comprise high-voltage and low-voltage components. The high-voltage component is operated under a high voltage. It is noted that the breakdown voltage of the high-voltage component must be high to prevent damage. For example, $V_{cc}$ of a high-voltage component may be about 24 to about 35 V, and the breakdown voltage of the high-voltage component should be at least 1.2 times its $V_{cc}$ value. As the device size continues decreasing, maintaining breakdown voltage will become more critical.

SUMMARY

In this disclosure, a semiconductor structure comprising a field-adjusting structure is provided. The semiconductor structure is suitable for operating under a high voltage condition.

According to one aspect of the disclosure, the semiconductor structure comprises a substrate, a gate, a source region, a drain region and a field-adjusting structure. The gate is disposed on the substrate. The source region and the drain region are disposed in the substrate and at opposite sides of the gate. The field-adjusting structure is disposed on the substrate at an outer side of one of the source region and the drain region. The field-adjusting structure comprises a first portion and a second portion. The second portion is disposed at an outer side of the first portion. The first portion is connected to the gate. The second portion is connected to the one of the source region and the drain region.

According to another aspect of the disclosure, the semiconductor structure comprises a substrate, a gate dielectric, a gate, a first drift region, a second drift region, a first isolation structure, a first heavily doped region and a field-adjusting structure. The gate dielectric is disposed on the substrate. The gate is disposed on the gate dielectric. The first drift region is disposed in the substrate and partially under the gate. The first drift region has a first conductive type. The second drift region is disposed in the substrate at an outer side of the first drift region. The second drift region is separated from the first drift region. The second drift region has a second conductive type. The first isolation structure is disposed between the first drift region and the second drift region. The first isolation structure isolates the second drift region from the first drift region. The first heavily doped region is disposed in the first drift region. The first heavily doped region has the first conductive type. The field-adjusting structure is disposed on the first isolation structure. The field-adjusting structure comprises a first portion and a second portion. The first portion is located in an area defined by the first drift region and is connected to the gate. The second portion is located in an area defined by the second drift region and is connected to the first heavily doped region.

Figure 1A:
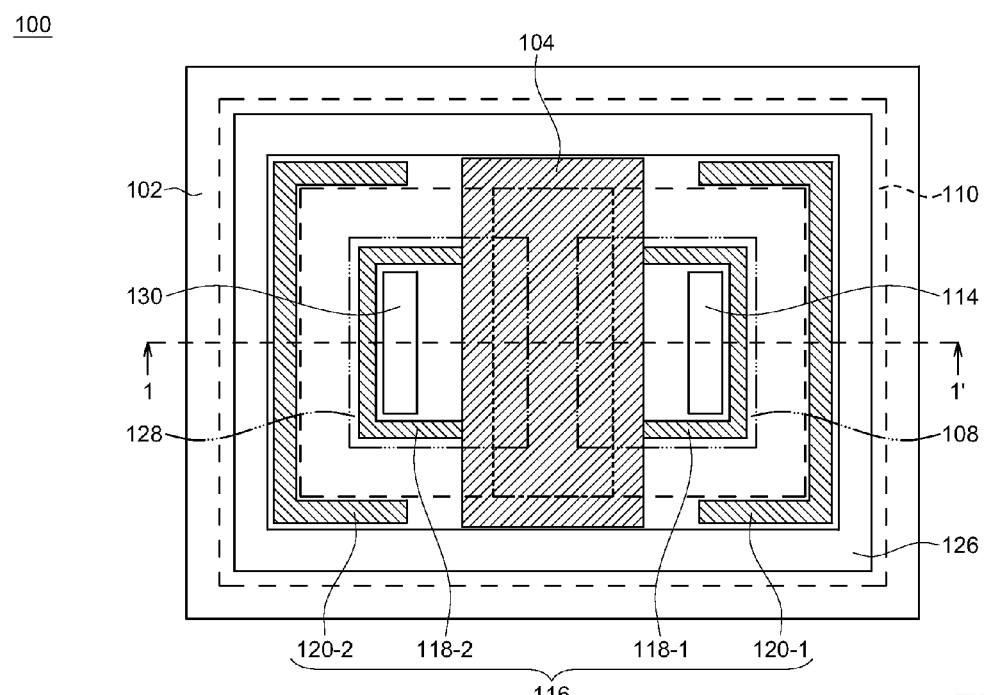
FIGS. 1A-1B schematically show a semiconductor structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Now the description is directed to said semiconductor structure. It is noted that when an element is described as being "disposed on," "disposed under," . . . , or "connected to" another element, it can be directly disposed on, disposed under, . . . , or connected to the other element, or at least one intervening element may be present.

Figure 1B:
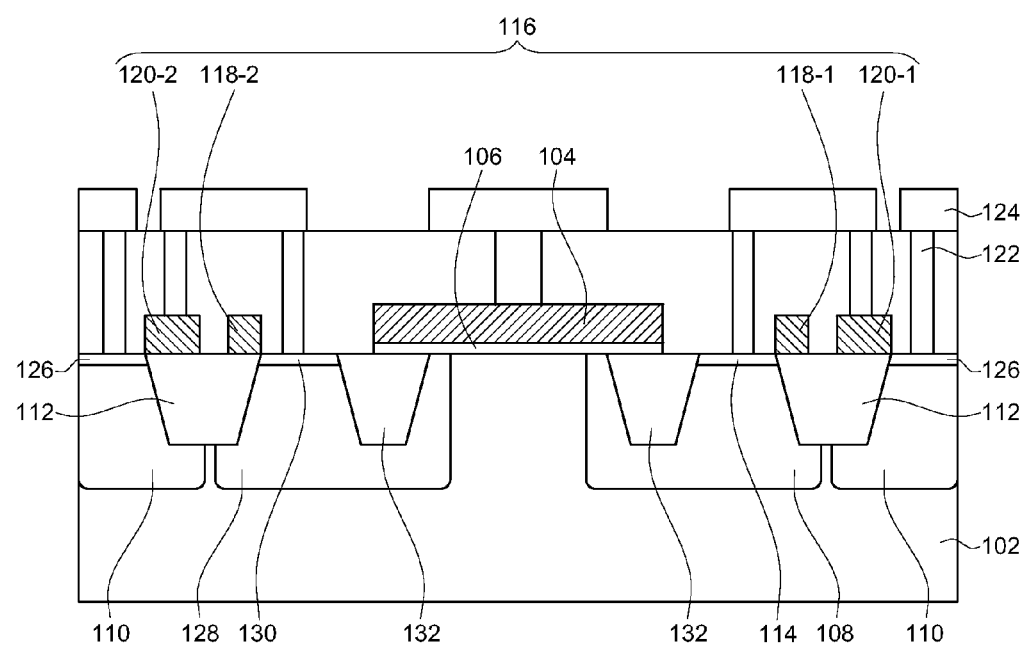

Referring to FIGS. 1A-1B, a semiconductor structure 100 according to one embodiment is shown, wherein FIG. 1A is a top view of the semiconductor structure 100, and FIG. 1B is a cross-sectional view of the semiconductor structure 100 taken along line 1-1' in FIG. 1A. The semiconductor structure 100 comprises a substrate 102, a gate 104, a first heavily doped region 114 and a field-adjusting structure 116. The gate 104 is disposed on the substrate 102. For example, the semiconductor structure 100 may further comprise a gate dielectric 106 disposed on the substrate 102, and the gate 104 is disposed on the gate dielectric 106. The first heavily doped region 114 is disposed in the substrate 102 at one side of the gate 104. The first heavily doped region 114 has a first conductive type. The substrate 102 may have a second conductive type. The first conductive type may be n-type, and the second conductive type may be p-type.

The field-adjusting structure 116 is disposed on the substrate 102 at an outer side of the first heavily doped region 114. In this disclosure, when saying an element A is (disposed) at an outer side of an element B, it means that, seeing from a top view, the element A is (disposed) at the side of the element B opposite to the side (of the element B) close to the gate. The field-adjusting structure 116 may be made of a conductive material, such as poly-silicon or a metal conductive material. For example, the field-adjusting structure 116 may be made of the same material as the gate 104, such as poly-silicon, and the field-adjusting structure 116 and the gate 104 may be formed by the same manufacturing steps. Even so, a dielectric layer may not exist under the field-adjusting structure 116. Alternatively, the field-adjusting structure 116 may be made of the same materials as other elements of the IC that are formed of at least one conductive material, such as vias 122, metal layers 124, 324-1 and 324-2, or the like. In such a case, the field-adjusting structure 116 may have the layout configuration shown in FIG. 1A. Further, in one embodiment, the field-adjusting structure 116 and the vias 122 are formed independently, as shown in FIG. 1B. Alternatively, the field-adjusting structure 116 and the vias 122 are formed by the same manufacturing steps from the same materials, and have the same heights. In this case, a via 122 correspondingly disposed on the field-adjusting structure 116 is unneeded. It is noted that the disclosure is not limited thereto.

The semiconductor structure 100 may further comprise a first drift region 108. The first drift region 108 is disposed in the substrate 102 and partially under the gate 104. The first drift region 108 has the first conductive type. In such a case, the first heavily doped region 114 may be disposed in the first drift region 108.

The semiconductor structure 100 may further comprise a second drift region 110. The second drift region 110 is disposed in the substrate 102 at an outer side of the first drift region 108. The second drift region 110 is separated from the first drift region 108. The second drift region 110 has the second conductive type.

The semiconductor structure 100 may further comprise a first isolation structure 112, such as a shallow trench isolation (STI) structure. The first isolation structure 112 is disposed between the first drift region 108 and the second drift region 110. The first isolation structure 112 isolates the second drift region 110 from the first drift region 108.

The field-adjusting structure 116 may be disposed on the first isolation structure 112. The field-adjusting structure 116 comprises a first portion 118-1 and a second portion 120-1. The first portion 118-1 may be located in an area defined by the first drift region 108. The second portion 120-1 may be located in an area defined by the second drift region 110. Referring to FIG. 1A, as shown in the top view, the field-adjusting structure 116 is disposed at an outer side of the first heavily doped region 114 (which is positioned in the first drift region 108), and the second portion 120-1 is disposed at an outer side of the first portion 118-1. The first portion 118-1 is connected to the gate 104, and the second portion 120-1 is connected to the first heavily doped region 114. The connections may be constructed by physical contacts or by intervening element, such as vias 122 and a metal layer 124.

The semiconductor structure 100 may further comprise a second heavily doped region 126. The second heavily doped region 126 is disposed in the second drift region 110. The second heavily doped region 126 has the second conductive type. The second heavily doped region 126 may surround the gate 104, the first heavily doped region 114, and a third heavily doped region 130 which will be described in the following paragraphs, and the field-adjusting structure 116, and be used as a guard ring.

The semiconductor structure 100 may further comprise a third drift region 128. The third drift region 128 is disposed in the substrate 102 and partially under the gate 104. The first drift region 108 and the third drift region 128 are disposed at opposite sides of the gate 104. The third drift region 128 has the first conductive type. The second drift region 110 may be also disposed at an outer side of the third drift region 128 and separated from the third drift region 128. The first isolation structure 112 may be also disposed between the third drift region 128 and the second drift region 110, and isolate the second drift region 110 from the third drift region 128.

The semiconductor structure 100 may further comprise the third heavily doped region 130. The third heavily doped region 130 is disposed in the substrate 102 at the side of the gate 104 opposite to the first heavily doped region 114. The third heavily doped region 130 may be disposed in the third drift region 128. The third heavily doped region 130 has the first conductive type. One of the first heavily doped region 114 and the third heavily doped region 130 may be used as a source region of the semiconductor structure 100, and the other one may be used as a drain region. For example, the third heavily doped region 130 may be used as the source region, and the first heavily doped region 114 may be used as the drain region.

The field-adjusting structure 116 may further comprise another first portion 118-2 and another second portion 120-2. The first portion 118-2 may be located in an area defined by the third drift region 128. The second portion 120-2 may be located in an area defined by the second drift region 110. Referring to FIG. 1A, as shown in the top view, the field-adjusting structure 116 may be further disposed at an outer side of the third heavily doped region 130 (which is positioned in the third drift region 128), and the second portion 120-2 is disposed at an outer side of the first portion 118-2. The first portion 118-2 is connected to the gate 104, and the second portion 120-2 is connected to the third heavily doped region 130. Similarly, the connections may be constructed by physical contacts or by intervening element, such as vias 122 and a metal layer 124. In this embodiment, the connections of the first portions 118-1 and 118-2 are constructed by physical contacts, and the connections of the second portions 120-1 and 120-2 are constructed by vias 122 and a metal layer 124.

The semiconductor structure 100 may further comprise two second isolation structures 132, such as STI structures. One of them is disposed between the gate 104 and the first heavily doped region 114, and the other one is disposed between the gate 104 and the third heavily doped region 130.

In this embodiment, the first portions 118-1 and 118-2 are U-shape, and the second portions 120-1 and 120-2 are U-shape. By disposing the field-adjusting structure 116, a local electric field can be adjusted. As such, the semiconductor structure 100 can have a higher breakdown voltage. Compared to a semiconductor structure without the field-adjusting structure, the breakdown voltage of the semiconductor structure with a field-adjusting structure can improved, for example, about 12.5%. In the same time, other characteristics of the semiconductor structure, such as $V_t$, $I_{on}$, $I_{off}$, and the like, are substantially the same.

Figure 2A:
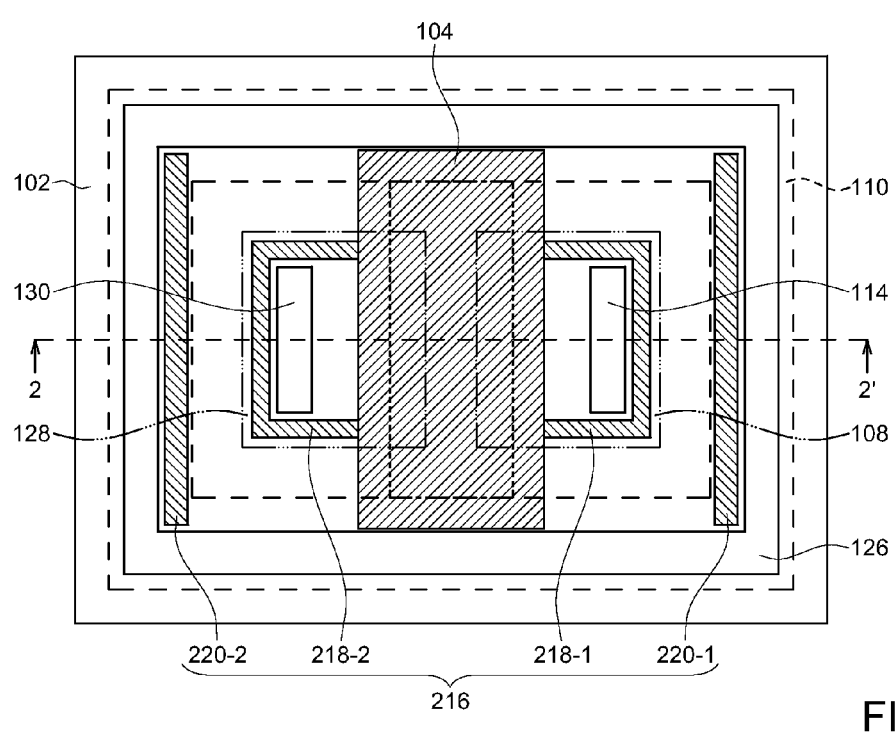
FIGS. 2A-2B schematically show a semiconductor structure according to another embodiment.
Figure 2B:
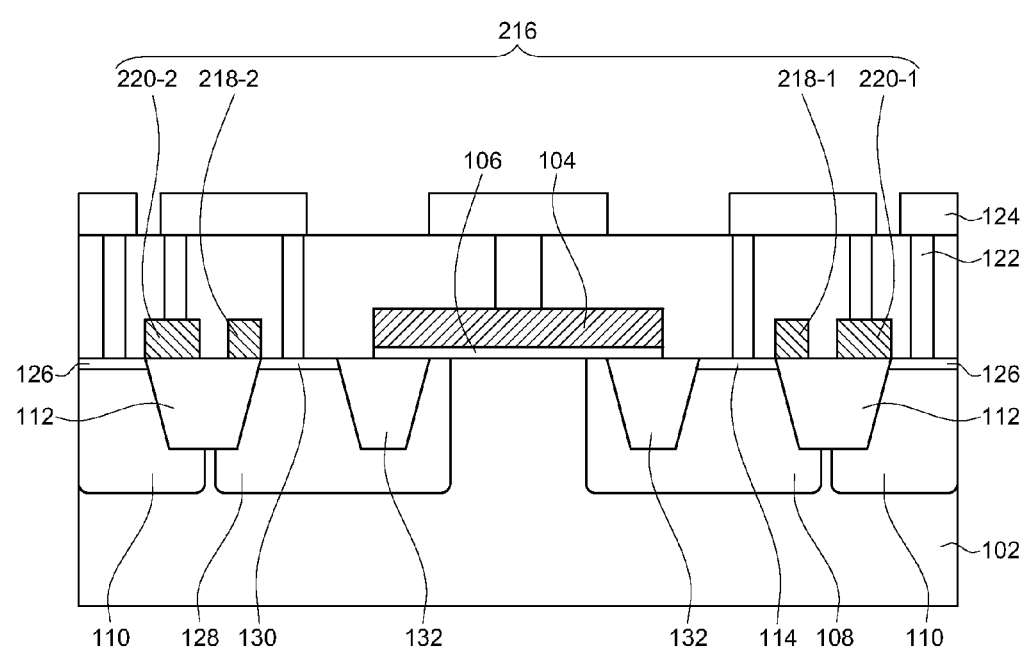

Referring to FIGS. 2A-2B, a semiconductor structure 200 according to another embodiment is shown, wherein FIG. 2A is a top view of the semiconductor structure 200, and FIG. 2B is a cross-sectional view of the semiconductor structure 200 taken along line 2-2' in FIG. 2A. The semiconductor structure 200 differs from the semiconductor structure 100 in the configuration of the field-adjusting structure 216. In this embodiment, the first portions 218-1 and 218-2 are U-shape, and the second portions 220-1 and 220-2 are linear. In this embodiment, the connections of the first portions 218-1 and 218-2 are constructed by physical contacts, and the connections of the second portions 220-1 and 220-2 are constructed by vias 122 and a metal layer 124.

Figure 3A:
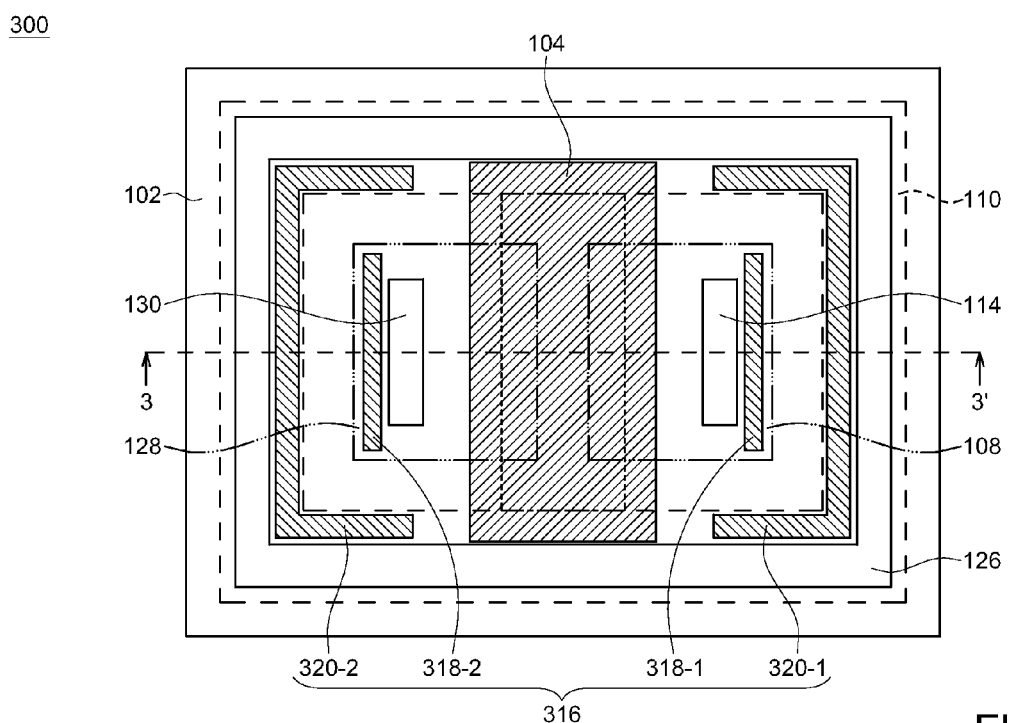
FIGS. 3A-3B schematically show a semiconductor structure according to still another embodiment.
Figure 3B:
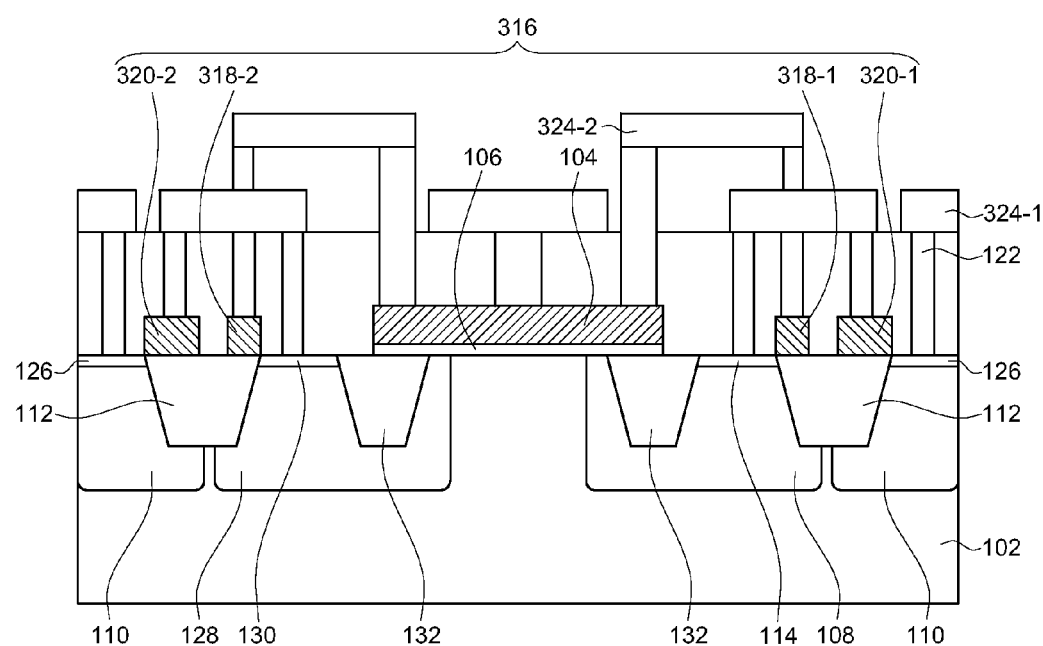

Referring to FIGS. 3A-3B, a semiconductor structure 300 according to still another embodiment is shown, wherein FIG. 3A is a top view of the semiconductor structure 300, and FIG. 3B is a cross-sectional view of the semiconductor structure 300 taken along line 3-3' in FIG. 3A. The semiconductor structure 300 differs from the semiconductor structures 100 and 200 in the configuration of the field-adjusting structure 316. In this embodiment, the first portions 318-1 and 318-2 are linear, and the second portions 320-1 and 320-2 are U-shape. In this embodiment, the connections of the first portions 318-1 and 318-2, and the connections of the second portions 320-1 and 320-2 are constructed by vias 122 and metal layers 324-1 and 324-2, wherein the metal layers 324-1 and 324-2 are disposed at different levels.

In summary, the addition of the field-adjusting structure, as in this disclosure, will improve the breakdown voltage of the semiconductor structure, while keep the other characteristics. The semiconductor structure according to this disclosure is suitable for applying in a small display driver IC, but not limited thereto.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
    a substrate;
    a gate disposed on the substrate;
    a source region and a drain region disposed in the substrate and at opposite sides of the gate; and
    a field-adjusting structure disposed on the substrate at an outer side of one of the source region and the drain region, the field-adjusting structure comprising a first portion and a second portion, wherein the second portion is disposed at an outer side of the first portion, the first portion is connected to the gate, and the second portion is connected to the one of the source region and the drain region;
    wherein the field-adjusting structure is further disposed at an outer side of the other one of the source region and the drain region, and wherein the field-adjusting structure further comprises another first portion and another second portion, the another second portion is disposed at an outer side of the another first portion, the another first portion is connected to the gate, and the another second portion is connected to the other one of the source region and the drain region.

2. The semiconductor structure according to claim 1, further comprising:
    a guard ring disposed in the substrate, the guard ring surrounding the gate, the source region, the drain region and the field-adjusting structure.

3. The semiconductor structure according to claim 1, wherein the first portion is linear.

4. The semiconductor structure according to claim 1, wherein the first portion is U-shape.

5. The semiconductor structure according to claim 1, wherein the second portion is linear.

6. The semiconductor structure according to claim 1, wherein the second portion is U-shape.

7. The semiconductor structure according to claim 1, wherein the field-adjusting structure comprises poly-silicon.

8. The semiconductor structure according to claim 1, wherein the field-adjusting structure comprises at least one conductive material.

9. A semiconductor structure, comprising:
    a substrate;
    a gate dielectric disposed on the substrate;
    a gate disposed on the gate dielectric;
    a first drift region disposed in the substrate and partially under the gate, the first drift region having a first conductive type;
    a second drift region disposed in the substrate at an outer side of the first drift region, the second drift region separated from the first drift region, the second drift region having a second conductive type;
    a first isolation structure disposed between the first drift region and the second drift region, the first isolation structure isolating the second drift region from the first drift region;
    a first heavily doped region disposed in the first drift region, the first heavily doped region having the first conductive type; and
    a field-adjusting structure disposed on the first isolation structure, the field-adjusting structure comprising a first portion and a second portion, wherein the first portion is located in an area defined by the first drift region and is connected to the gate, and the second portion is located in an area defined by the second drift region and is connected to the first heavily doped region.

10. The semiconductor structure according to claim 9, further comprising:
    a second heavily doped region disposed in the second drift region, the second heavily doped region having the second conductive type.

11. The semiconductor structure according to claim 10, further comprising:
    a third drift region disposed in the substrate and partially under the gate, the third drift region having the first conductive type, wherein the first drift region and the third drift region are disposed at opposite sides of the gate, wherein the second drift region is also disposed at an outer side of the third drift region and separated from the third drift region, and wherein the first isolation structure is also disposed between the third drift region and the second drift region and isolates the second drift region from the third drift region; and
    a third heavily doped region disposed in the third drift region, the third heavily doped region having the first conductive type;
    wherein the field-adjusting structure further comprises another first portion and another second portion, wherein the another first portion is located in an area defined by the third drift region and is connected to the gate, and the another second portion is located in an area defined by the second drift region and is connected to the third heavily doped region.

12. The semiconductor structure according to claim 11, further comprising:
    two second isolation structures, one of the two second isolation structures disposed between the gate and the first heavily doped region, and the other one of the two second isolation structures disposed between the gate and the third heavily doped region.

13. The semiconductor structure according to claim 9, wherein the substrate has the second conductive type.

14. The semiconductor structure according to claim 9, wherein the first conductive type is n-type, and the second conductive type is p-type.

15. The semiconductor structure according to claim 9, wherein the field-adjusting structure comprises poly-silicon.

16. The semiconductor structure according to claim 9, wherein the field-adjusting structure comprises at least one conductive material.

* * * * *